(12) United States Patent
Lo et al.

(10) Patent No.: US 6,242,283 B1
(45) Date of Patent: Jun. 5, 2001

(54) WAFER LEVEL PACKAGING PROCESS OF SEMICONDUCTOR

(75) Inventors: Randy H. Y. Lo, Taichung Hsien; Chi-Chuan Wu, Taichung, both of (TW)

(73) Assignee: Siliconware Precision Industries Co., Ltd., Taichung Hsien (TW)

( * ) Notice: Subject to any disclaimer, the term of this patent is extended or adjusted under 35 U.S.C. 154(b) by 0 days.

(21) Appl. No.: 09/474,998

(22) Filed: Dec. 30, 1999

(51) Int. Cl.[7] .......................... H01L 21/44; H01L 21/48; H01L 21/50

(52) U.S. Cl. .......................... 438/106; 438/110; 438/113; 438/118; 257/723; 257/724

(58) Field of Search .................... 438/106, 107, 438/110, 111, 112, 118; 257/724, 723

(56) References Cited

U.S. PATENT DOCUMENTS

| | | | |
|---|---|---|---|
| 4,843,036 | * | 6/1989 | Schmidt et al. .......................... 438/64 |
| 4,892,245 | * | 1/1990 | Dunaway et al. ................. 228/180.2 |
| 5,677,576 | * | 10/1997 | Akagawa .............................. 257/785 |
| 5,917,242 | * | 6/1999 | Ball ...................................... 257/737 |
| 5,920,118 | * | 7/1999 | Kong .................................... 257/684 |
| 5,990,546 | * | 11/1999 | Igarashi et al. ....................... 257/700 |
| 6,054,772 | * | 4/2000 | Mostafazadeh et al. ............. 257/781 |

* cited by examiner

Primary Examiner—Vu A. Le
Assistant Examiner—Christian D. Wilson
(74) Attorney, Agent, or Firm—Jiawei Huang; J.C. Patents

(57) ABSTRACT

A wafer level packaging process comprises the following steps: First of all, to bond directly a carrier's substrate to a die wherein the substrate has connecting points such as bumps formed or having solder balls planted. Thereafter, to perform wire-bonding process in order to electrically connect the dies on the wafer to the corresponding carriers respectively. Subsequently, to perform encapsulating process in order to protect the connecting portion between the dies and the carriers. Finally a die-sawing process is performed in order to form packages of the wafer level packaging.

20 Claims, 3 Drawing Sheets

WAFER LEVEL PACKAGING PROCESS OF SEMICONDUCTOR

BACKGROUND OF THE INVENTION

1. Field of the Invention

This invention relates to a packaging process of semiconductor, and more particularly to a wafer level packaging process of semiconductor.

2. Description of Related Art

After completing the manufacturing of semiconductor devices on the wafer, the conventional packaging process is to perform a die sawing step in order to cut the wafer into many dies, then to perform packaging process respectively so as to form various types of IC packages. However, since the semiconductor devices formed on the wafer are very tiny in size, they are subject to damage resulted from die handling, small particles in the air, moisture and airflow etc.

The foregoing problems are resulted from the process that performs packaging process after the dies are cut from the wafer. A conventional way to resolve the problems is to perform the wafer level process first before performing the die sawing process. Additionally, the package size of the wafer level packaging is closed to that of the die, thereby the size of the package can be greatly reduced which meet the current requirements of "Light, Thin, Short, and Small" in packaging design.

However, the conventional wafer level packaging processes consisting of processes such as flux coating on the carrier of the wafer, and solder-ball planting etc. are apt to damage the surface of the wafer or contaminate the devices. Moreover, since the flux coated on the carrier is hard to get rid of, thereby, the flux is apt to remain on the wafer. The residual flux on the wafer will affect the electrical performance of the semiconductor products, and consequently will reduce the yield and increase the manufacturing cost.

SUMMARY OF THE INVENTION

Therefore, the present invention provides a wafer level packaging process of semiconductor. The process is described as follows: First of all, it is to provide a substrate, having a first surface and a second surface wherein the substrate is constituted by a plurality of carriers densely disposed is series. And each of the carriers has an opening located at the center portion of the carrier, and a plurality of bonding fingers is disposed on the second surface at the periphery of the opening. Also, a plurality of connecting points is disposed on the outer edges of the bonding fingers that are electrically connected to the connecting points. Next, to provide a wafer constituted by a plurality of dies wherein an active surface of the die has a plurality of bonding pads. Then, to provide an adhesive layer in order to bond the first surface of the substrate to the active surface of the die wherein each of the carriers corresponds to each of the dies, and the bonding pads are corresponding to the openings of the carriers. Thereafter, to perform a wire bonding process in order to form a plurality of bond wires to make electrical connections between the bonding pads of the dies and their corresponding bonding fingers of the carriers. Subsequently, to perform an encapsulating process by using a molding compound to fill the openings and to encase the bond wires, the bonding pads, and the bonding fingers. Finally, to perform a die sawing process in order to form a plurality of complete packages of a wafer level packaging.

In accordance with a preferred embodiment of the present invention, the process for forming connecting points comprises bumps formed by electroplating and electro-plateless process or solder balls formed by solder-ball planting wherein the bumps are balls or flat plates in shape. Besides, the material of the connecting points comprises a tin-lead alloy having high percentage of content in lead and having relatively high melting point.

In the process of the present invention, the dies are bonded to the carriers after the bumps are formed on the carriers, thereby, the die are protected from being contaminated and damaged, consequently, the yield can be improved and the manufacturing cost can be lowered.

BRIEF DESCRIPTION OF DRAWINGS

The objectives, characteristics, and advantages of the present invention can be more fully understood by reading the following detailed description of the preferred embodiments, with reference made to the accompanying drawings as follows.

DETAILED DESCRIPTION OF PREFERRED EMBODIMENT

Figure 1A:
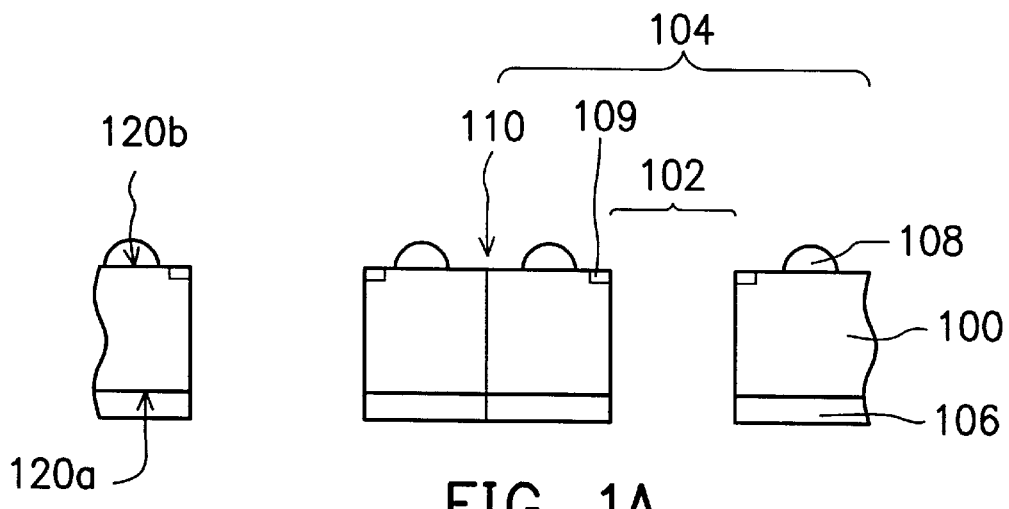
FIG. 1A to FIG. 1E are cross-sectional views illustrating the process flow of a wafer level packaging of a preferred embodiment according to the present invention.
Figure 1B:
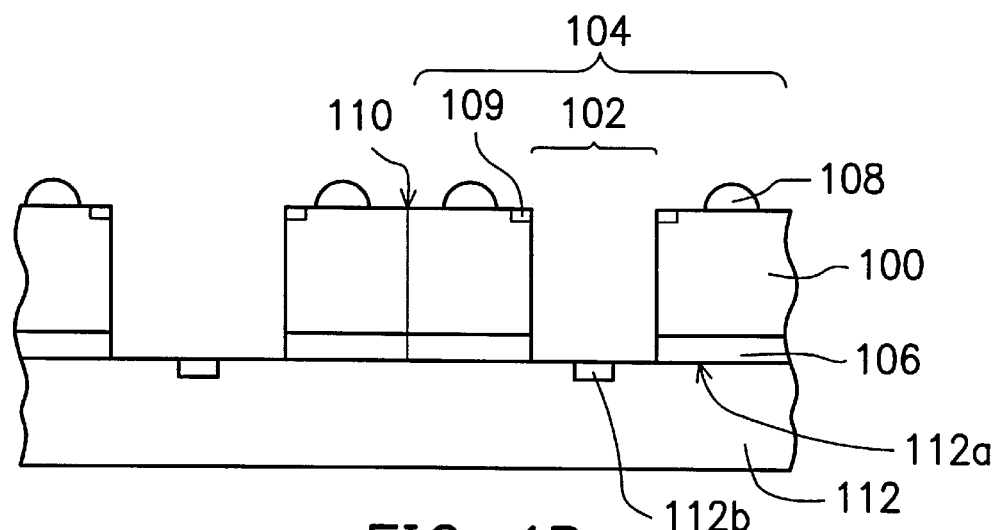
Figure 1C:
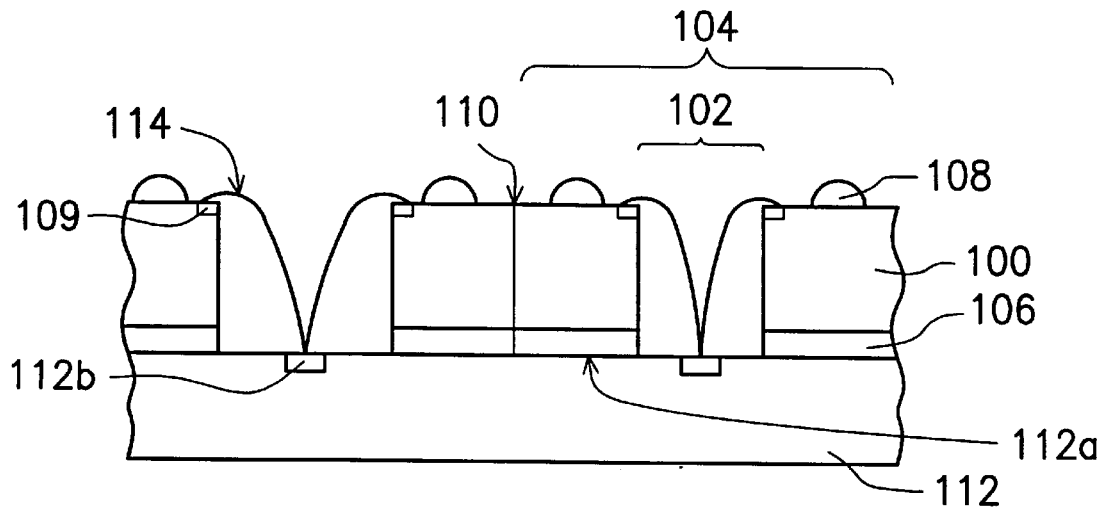
Figure 1D:
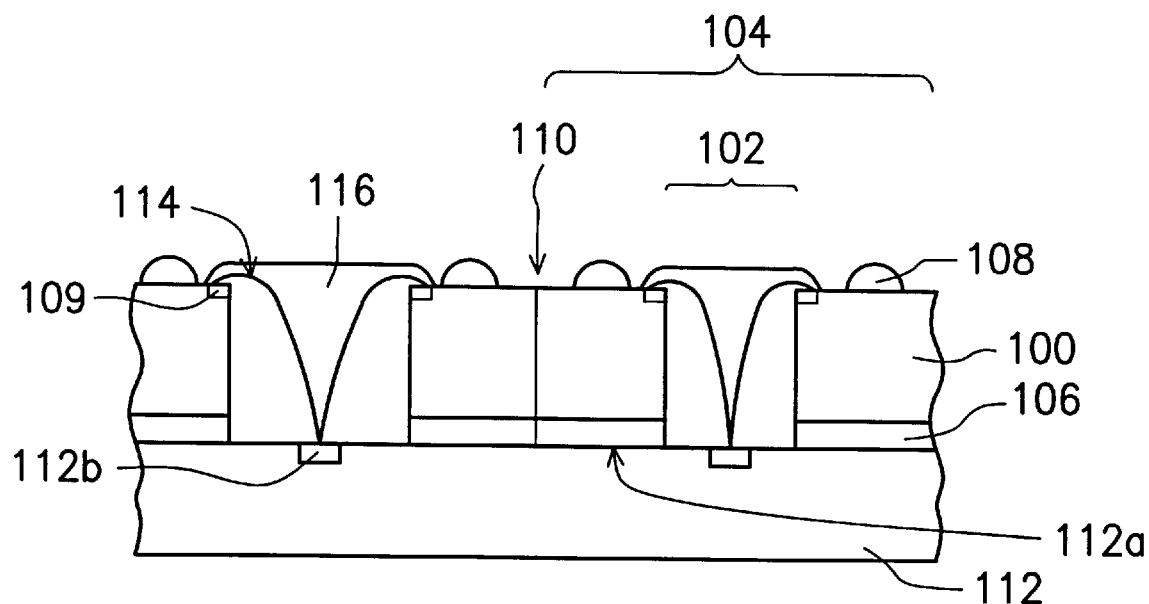
Figure 1E:
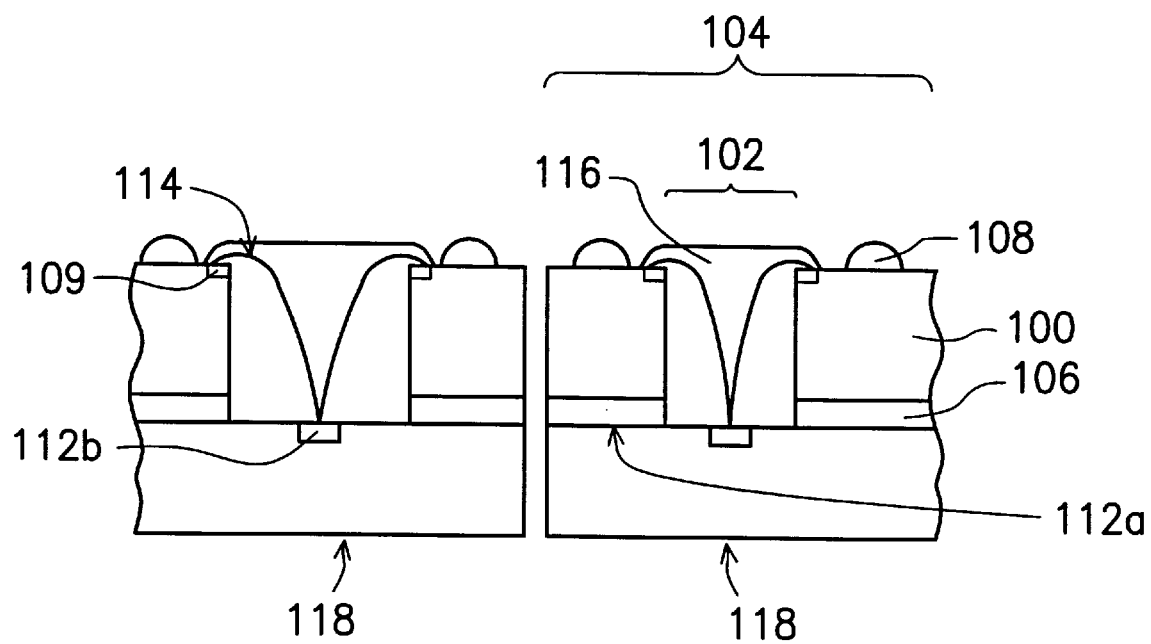
Figure 2:
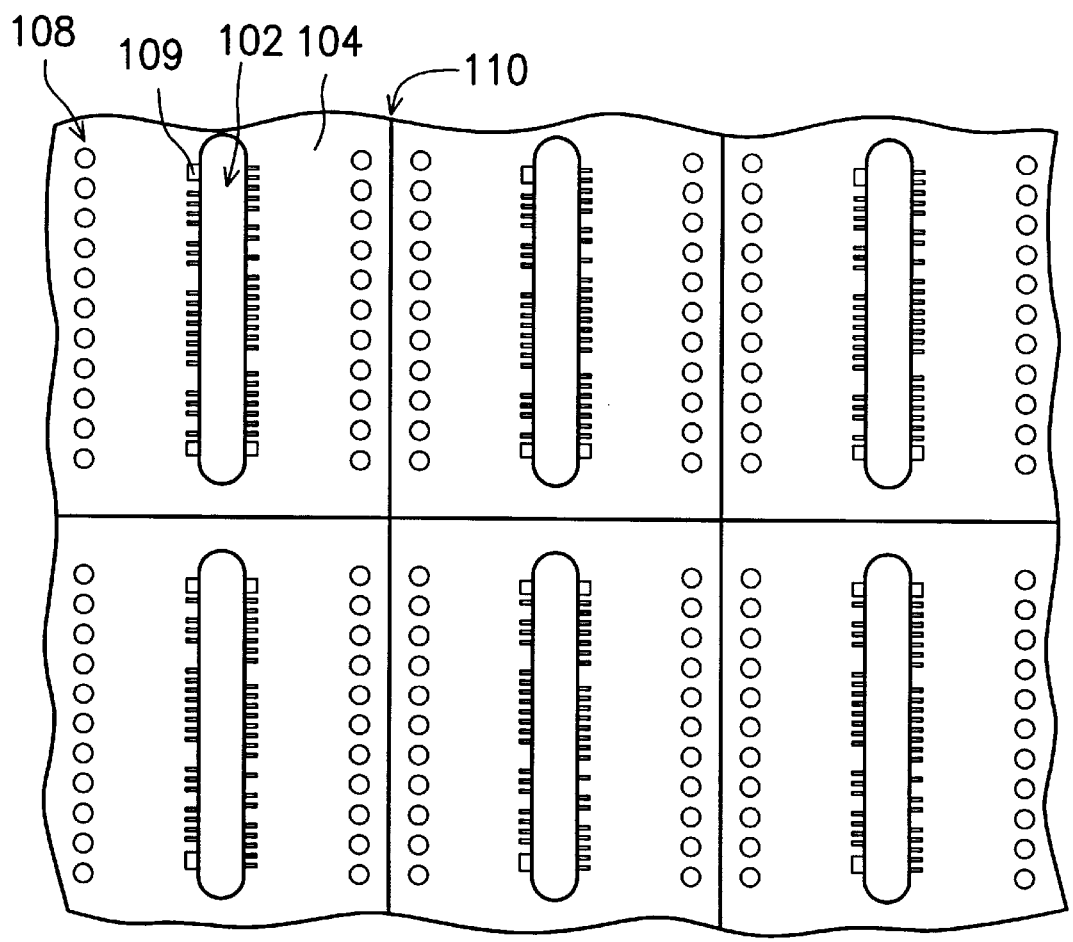
FIG. 2 is a partial top view of the carrier shown in FIG. 1A of the present invention.

FIG. 1A to FIG. 1E are cross-sectional views illustrating the process flow of a wafer level packaging of a preferred embodiment according to the present invention while FIG. 2 is a partial top view of the carrier. As shown in FIG. 1A and FIG. 2, a substrate 100, which is constituted by a plurality of carriers 104 densely disposed in series, is provided. The substrate 100 has a first surface 120a and a second surface 120b. A scribe line 110 is set up between each of the two adjacent carriers 104, and each of the carriers 104 has an opening 102 at its center portion. A plurality of bonding fingers 109 is disposed at the periphery of the opening 102 on the second surface 120b while a plurality of connecting points 108 is disposed on the outer edges of the bonding fingers 109. The bonding fingers 109 and the connecting points 108 are electrically connected by the conductive traces (not shown) respectively. The material used by the substrate 100 can be a soft substrate such as polyimide and a scroll tape type of carrier formed by laminated copper foil or hard substrate such as a common laminated board for example.

Figure 3:
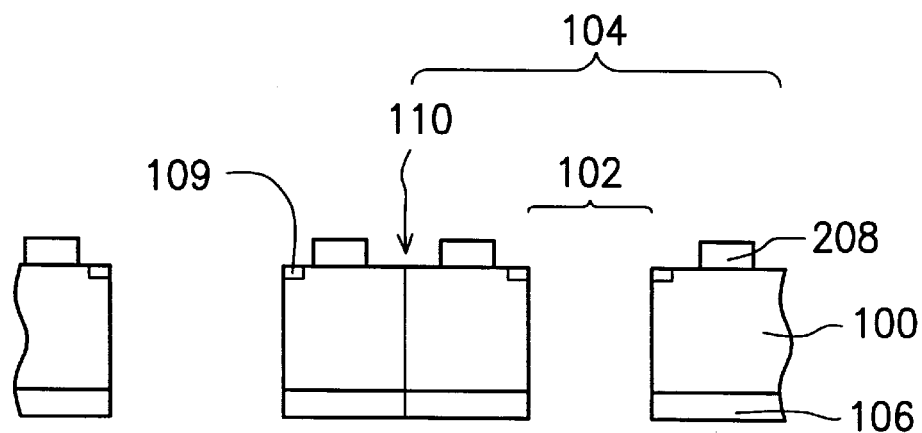
FIG. 3 is a cross-sectional view of an another bump of the present invention.

Besides, an adhesive layer 106 is formed on the first surface 120a of the substrate 100. The ways of forming connecting points 108 on the carrier 104 includes using an electroplating method, or an electro-plateless method. These methods are used to form a bump on the carrier 104 or a solder planting method is used to form a solder ball on the carrier 104 wherein the bump and the solder ball are electrically connected to the circuit board in the subsequent process. The shape of the solder ball can be either in ball shape as shown in FIG. 1A or in the shape of a flat plate as shown later in FIG. 3. Moreover, the material of the connecting points 108 has relatively high melting point to prevent the connecting points 108 from being deformed under high temperature in the subsequent wire bonding process. This kind of material comprises a tin-lead alloy having high percentage content in lead. In additions, the package of the present invention can be reworked easily due to the fact that the connecting point has very high melting point.

The conventional wafer level packaging forms connecting points or performs solder-ball planting on the carrier after the die is bonded to the carrier. However, since these processes for forming, connecting points or planting solder balls includes also a series of cleaning and thermal processes, thereby, the dies are subject to be contaminated or damaged. Consequently, the yield of the products will be lowered and the cost will be relatively high.

Besides, as mentioned above, since the present invention forms the connecting points on the carrier 104 first, then bonds the dies to the carrier 104 in the subsequent process, it can protect the die from being contaminated or damaged, thereby, can improve the yield and lower the manufacturing cost.

For the next step as shown in FIG. 1B, the carrier 104 is bonded to the active surface 112a of a wafer 112 through the adhesive layer 106 on the substrate 100. There are electric circuits (not shown) formed on the active surface 112a of the wafer. A bonding pad 112b which is disposed at the center of the opening 102 of the carrier 104 is formed also on the active surface 112a of the wafer 112, and the bonding pad 112b is electrically connected to the outside connectors.

For the next step as shown in FIG. 1C, a wire bonding process is perform by using bond wires 114 to make an electrical connection between the bonding pads 112b on the wafer 112 and the bonding fingers 109 on the carrier 104.

In the subsequent step as shown in FIG. 1D, an encapsulating process is performed by using a molding compound 116 to encase the bonding pad 112b formed on the active surface 112a, the bonding fingers 109 formed on the carrier 104, and the bond wire 114. The encapsulating process can employs methods such as molding screen printing, or dispensing (also called globe top).

Finally, a die sawing process as shown in FIG. 1E is performed to cut the wafer 118 along the scribe lines 110 into many packages 118 that complete a wafer level packaging.

The invention has been described using an exemplary preferred embodiment. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. A wafer level packaging process of semiconductor, comprising:

providing a substrate, having a first surface and a second surface wherein the substrate is comprised of a plurality of carriers densely disposed in series, and each of the carriers has an opening located at a center portion of the carrier, and a plurality of bonding fingers is disposed on the second surface at a periphery of the opening, and a plurality of connecting points is disposed on outer edges of the bonding fingers which are electrically connected to the connecting points;

providing a wafer comprised of a plurality of dies wherein an active surface of the die has a plurality of bonding pads;

providing an adhesive layer to bond the first surface of the substrate to the active surface of the die wherein each of the carriers corresponds to each of the dies, and the bonding pads correspond to the openings of the carriers;

performing a wire bonding process to form a plurality of bond wires to make electrical connections between the bonding pads of the dies and their corresponding bonding fingers of the carriers;

performing an encapsulating process by using a molding compound to fill the openings and to encase the bond wires, the bonding pads, and the bonding fingers; and performing a die sawing process to form a plurality of complete packages of a wafer level packaging.

2. The wafer level packaging process of semiconductor of claim 1, wherein the connecting points comprise bumps formed by electroplating.

3. The wafer level packaging process of semiconductor of claim 2 wherein the bumps are in ball shape.

4. The wafer level packaging process of semiconductor of claim 2 wherein the bumps are flat plates in shape.

5. The wafer level packaging process of semiconductor of claim 1, wherein the connecting points are formed by electroplateless process.

6. The wafer level packaging process of semiconductor of claim 5 wherein the bumps are in ball shape.

7. The wafer level packaging process of semiconductor of claim 5 wherein the bumps are flat plates in shape.

8. The wafer level packaging process of semiconductor of claim 1, wherein the connecting points comprise solder balls formed by solder-ball planting process.

9. The wafer level packaging process of semiconductor of claim 1 wherein the material of the connecting points comprise a tin-lead alloy having high percentage of content in lead.

10. The wafer level packaging process of semiconductor of claim 1 wherein the connecting points have relatively high melting point.

11. The wafer level packaging process of semiconductor of claim 1 wherein the encapsulating process comprises a molding.

12. The wafer level packaging process of semiconductor of claim 1 wherein the encapsulating process comprises a screen-printing.

13. The wafer level packaging process of semiconductor of claim 1, wherein the encapsulating process comprises dispensing, which is also called glob top.

14. A wafer level packaging process of semiconductor comprising:

providing a substrate having a first surface and a second surface, wherein the substrate has a plurality of carriers densely disposed in series, and each of the carriers has an opening located at a center portion of the carrier, and a plurality of bonding fingers is disposed on the second surface at a periphery of the opening, and a plurality of bumps having relatively high melting points is disposed at a periphery of the bonding fingers which are electrically connected to the bumps;

providing a wafer comprised of a plurality of dies, wherein an active surface of the die has a plurality of bonding pads;

providing an adhesive layer to bond the first surface of the substrate to the active surface of the die, wherein each of the carriers corresponds to each of the dies, and the bonding pads correspond to the openings of the carriers;

performing a wire bonding process to form a plurality of bond wires to make electrical connections between the bonding pads of the dies and their corresponding bonding fingers of the carriers;

performing an encapsulating process to encase the bond wires; and performing a die sawing process to form a plurality of IC packages.

15. The wafer level packaging process of semiconductor of claim 14, wherein a material for the bumps comprises a tin-lead alloy having a high percentage of content in lead.

16. The wafer level packaging process of semiconductor of claim 14, wherein the bumps are formed by electroplating.

17. The wafer level packaging process of semiconductor of claim 14, wherein the bumps are in ball shape of flat shape.

18. The wafer level packaging process of semiconductor of claim 14, wherein the bumps are formed by electroplateless process.

19. The wafer level packaging process of semiconductor of claim 14, wherein the bumps are formed by solder-ball planting process.

20. A semiconductor packaging process, comprising:

providing a substrate, wherein the substrate is comprised of a plurality of carriers densely disposed in series, and each of the carriers has an opening located at a center portion of the carrier, and each of the carriers already has a plurality of bonding fingers and a plurality of solder balls formed thereon;

performing a series of cleaning and thermal process on the substrate after the plurality of solder balls is formed; and bonding the substrate to active surfaces of a plurality of dies of a wafer.

* * * * *